(12) United States Patent
Lin et al.

(10) Patent No.: US 11,855,095 B2
(45) Date of Patent: Dec. 26, 2023

(54) SEMICONDUCTOR DEVICE

(71) Applicant: Taiwan Semiconductor Manufacturing Company, Ltd., Hsinchu (TW)

(72) Inventors: Cheng-I Lin, Hsinchu (TW); Chun-Heng Chen, Hsinchu (TW); Ming-Ho Lin, Taipei (TW); Chi-On Chui, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/707,942

(22) Filed: Mar. 29, 2022

(65) Prior Publication Data

US 2022/0223595 A1    Jul. 14, 2022

Related U.S. Application Data

(62) Division of application No. 16/805,858, filed on Mar. 2, 2020, now Pat. No. 11,296,084.

(60) Provisional application No. 62/907,714, filed on Sep. 29, 2019.

(51) Int. Cl.
*H01L 27/092* (2006.01)
*H01L 21/02* (2006.01)
*H01L 21/8238* (2006.01)

(52) U.S. Cl.
CPC ...... *H01L 27/0924* (2013.01); *H01L 21/0228* (2013.01); *H01L 21/02274* (2013.01); *H01L 21/823821* (2013.01)

(58) Field of Classification Search
None
See application file for complete search history.

(56) References Cited

U.S. PATENT DOCUMENTS

2017/0207217 A1\*  7/2017  Hellings ......... H01L 21/823431

\* cited by examiner

*Primary Examiner* — Asok K Sarkar
(74) *Attorney, Agent, or Firm* — JCIPRNET

(57) ABSTRACT

A semiconductor device includes a semiconductor substrate and a first dielectric layer. The semiconductor substrate includes at least one fin. The first dielectric layer is disposed on the at least one fin. A thickness of the first dielectric layer located on a top surface of the at least one fin is greater than a thickness of the first dielectric layer located on a sidewall of the at least one fin.

20 Claims, 16 Drawing Sheets

SEMICONDUCTOR DEVICE

CROSS-REFERENCE TO RELATED APPLICATION

This application is a divisional application of and claims the priority benefit of a prior application Ser. No. 16/805,858, filed on Mar. 2, 2020 and now allowed, which claims the priority benefit of U.S. provisional application Ser. No. 62/907,714, filed on Sep. 29, 2019. The entirety of each of the above-mentioned patent applications is hereby incorporated by reference herein and made a part of this specification.

BACKGROUND

As the semiconductor devices keep scaling down in size, three-dimensional multi-gate structures, such as the fin-type field effect transistor (FinFET), have been developed to replace planar CMOS devices. A characteristic of the FinFET device lies in that the structure has one or more silicon-based fins that are wrapped around by the gate to define the channel of the device. The gate wrapping structure further provides better electrical control over the channel.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
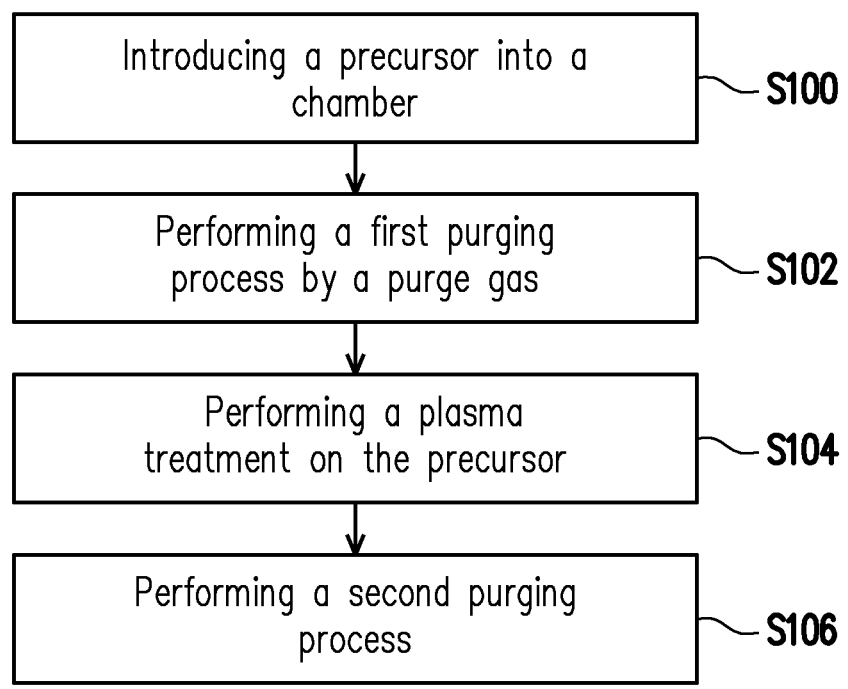
FIG. 1 is a flowchart of a deposition method in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

FIG. 1 is a flowchart of a deposition method in accordance with some embodiments of the disclosure. Referring to FIG. 1, a deposition method includes at least one cycle. In some embodiments, the deposition method may include a plurality of cycles. Each cycle includes at least the following steps S100, S102, S104, and S106. In some embodiments, the steps S100, S102, S104, and S106 may be performed sequentially.

At step S100, a precursor is introduced into a chamber. In some embodiments, the precursor may include silicon (Si), nitrogen (N), carbon (C), and hydrogen (H). In some embodiments, the precursor may be bis(diethylamino)silane (i.e., SAM-24).

At step S102, a first purging process is performed by a purge gas. The excess precursor may be removed by the first purging process. In some embodiments, the purge gas of first purging process may be an inert gas, $N_2$, $O_2$, $NH_3$, or a combination thereof. The inert gas may be He, Ar, or a combination thereof.

At step S104, a plasma treatment is performed on the precursor. Thereby, the precursor may be dissociated into ions, and the ions are bonded with dangling bonds to form a target film. In some embodiments, the gas used in the plasma treatment may be the same as the purge gas of the first purging process. In some embodiments, the gas in the plasma treatment may be an inert gas, $N_2$, $O_2$, $NH_3$, or a combination thereof. The inert gas may be He, Ar, or a combination thereof. In some embodiments, the material of the target film may include silicon carbide (SiC), silicon carbonitride (SiCN), silicon nitride (SiN), silicon oxide ($SiO_2$) or the like.

At step S106, a second purging process is performed. The second purging process may be used to remove unreacted substances in the chamber. In some embodiments, the purge gas of second purging process may be an inert gas, $N_2$, $O_2$, $NH_3$, or a combination thereof. The inert gas may be He, Ar, or a combination thereof.

In some embodiments, a pressure maintained in the chamber is higher than or equal to 3000 mTorr, a first purge time of the first purging process is less than or equal to 1 second, a time of the plasma treatment is less than or equal to 0.5 second, and a second purge time of the second purging process is less than or equal to 1 second. Thereby, the target film may be formed on the upper portion of the protrusion (e.g., a fin of a substrate) by setting the above process parameters. For example, the pressure maintained in the chamber may range from 3000 mTorr to 4000 mTorr, the first purge time of the first purging process may range from 0.1 to 1 second, the plasma treat time of the plasma treatment may range from 0.1 to 0.5 second, and the second purge time of the second purging process may range from 0.1 to 1 second.

Figure 2A:
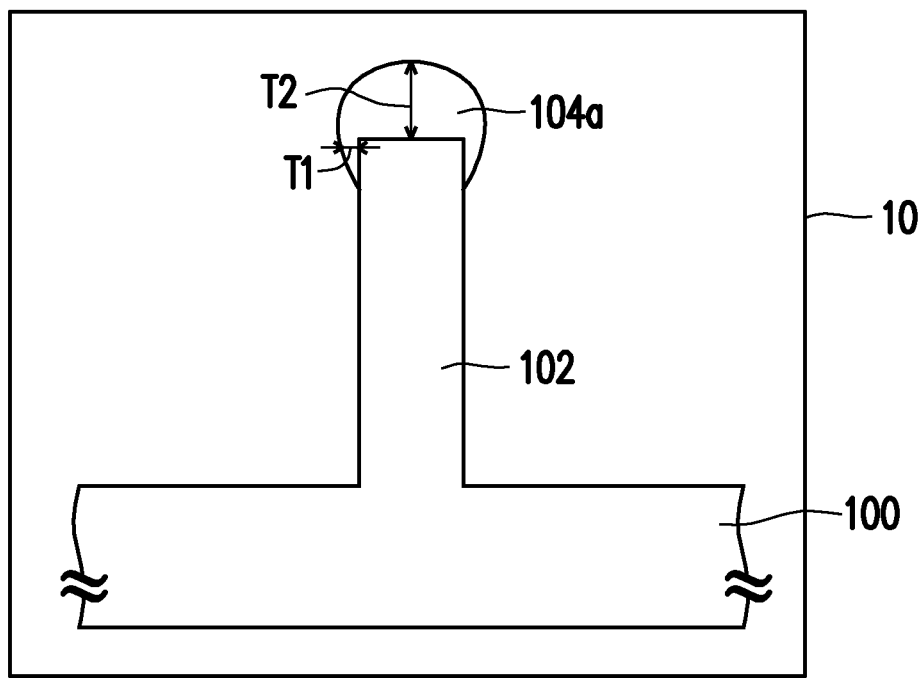
FIG. 2A and FIG. 2B are schematic diagrams illustrating layers formed by the deposition method of FIG. 1 in accordance with some embodiments of the disclosure.

FIG. 2A is a schematic diagram illustrating a layer formed by the deposition method of FIG. 1 in accordance with some embodiments of the disclosure. Referring to FIG. 2A, a layer 104a may be formed on a fin 102 of a substrate 100 by the deposition method of FIG. 1 in a chamber 10. The substrate 200 may be a bulk semiconductor substrate, a semiconductor-on-insulator (SOI) substrate, or the like. The layer 104a may be formed on an upper portion of the fin 102. In some embodiments, the layer 104a may be formed over a top surface of the fin 102. In addition, the layer 104a may be further disposed on a sidewall of the fin 102. That is, the layer 104a may be further extended onto the sidewall of the fin 102. Thus, the top surface and a portion of the sidewall of the fin 102 are covered by the layer 104a. In some embodiments, a thickness T1 of layer 104a on the sidewall of the fin 102 may be less than a thickness T2 of the layer 104a on the top surface of the fin 102. In some embodiments, a top surface of the layer 104a may be convex. In some embodiments, the layer 104a may have a chef hat shape or a helmet shape. The material of the layer 104a may be silicon carbide (SiC), silicon carbonitride (SiCN), silicon nitride (SiN), silicon oxide ($SiO_2$) or the like. In some embodiments, the layer 104a is in direct contact with the fin 102, for example. However, the disclosure is not limited thereto. In some alternative embodiments, a layer may be interposed between the layer 104a and the fin 102.

Figure 2B:
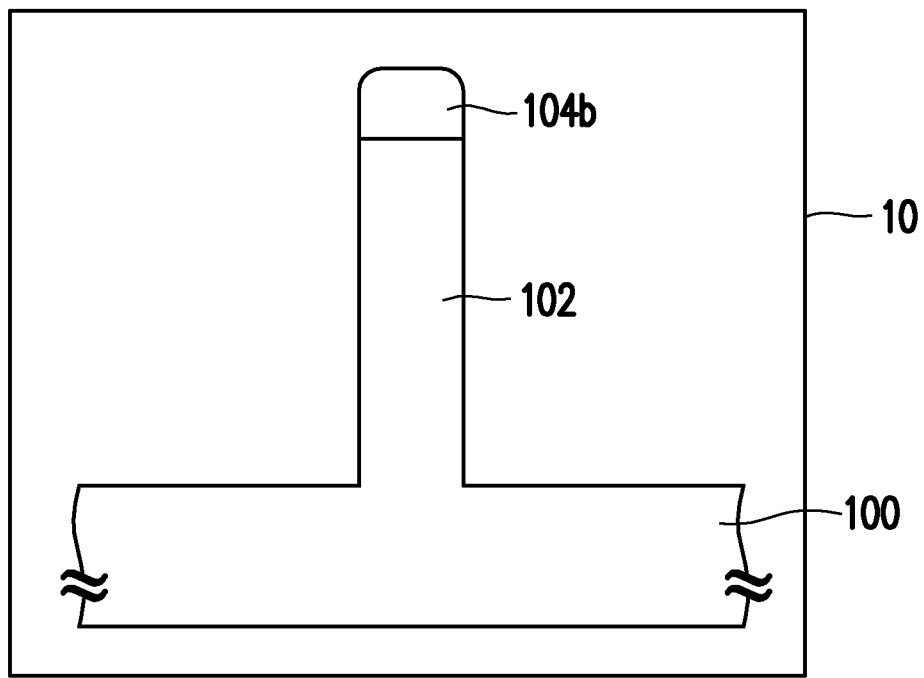

FIG. 2B is a diagram illustrating a layer formed by the deposition method of FIG. 1 in accordance with some embodiments of the disclosure. Referring to FIG. 2A and FIG. 2B, the differences between the layer 104b of FIG. 2B and the layer 104a of FIG. 2A lies in the sidewall of the layer 104b may be substantially flush with the sidewall of the fin 102. The layer 104b and the layer 104a may be formed by using different process parameters. Moreover, the same components in FIG. 2A and FIG. 2B are represented by the same reference numerals and are not repeated herein.

Figure 3A:
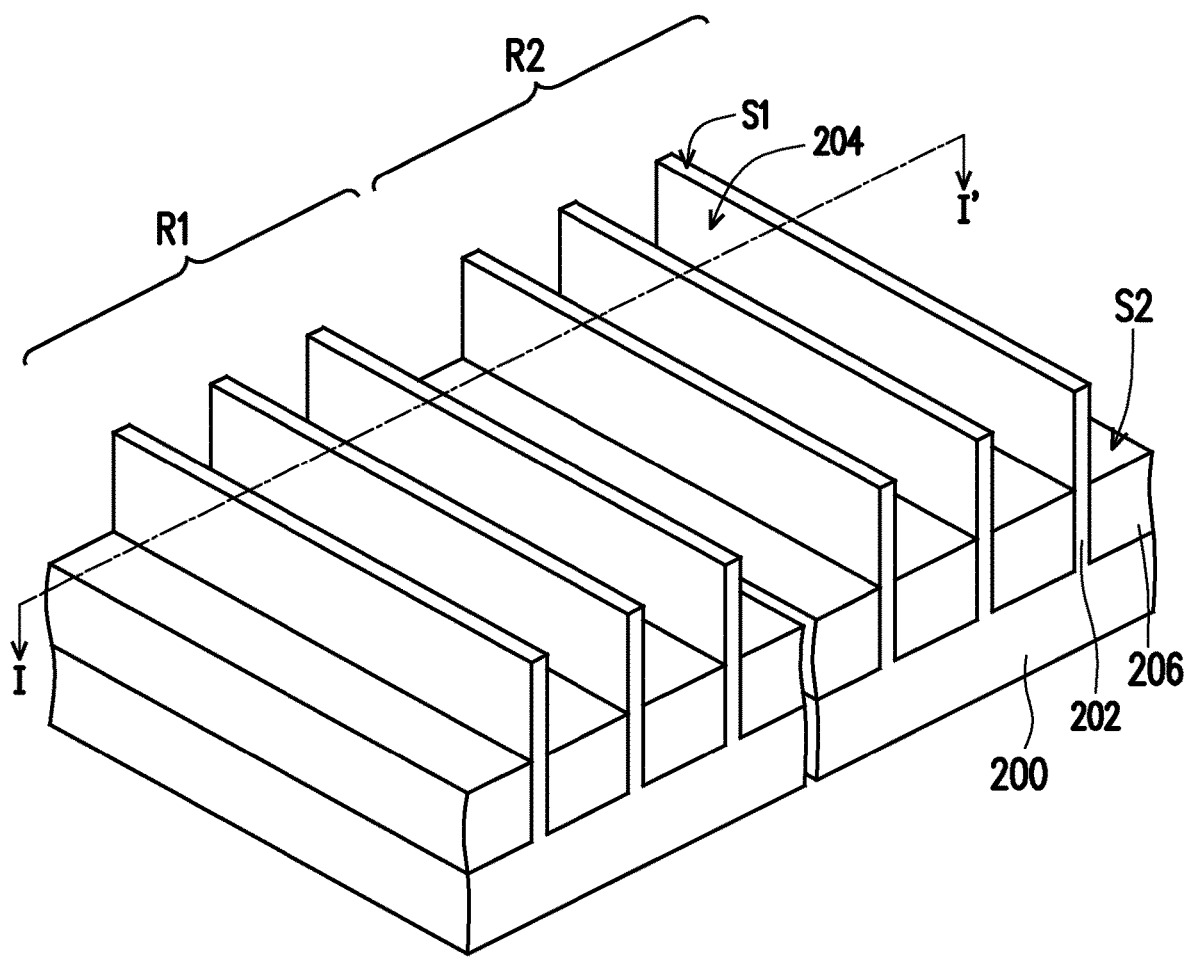
FIG. 3A to FIG. 3H are perspective views illustrating various stages of a method of fabricating semiconductor devices in accordance with some embodiments of the disclosure.
Figure 4A:
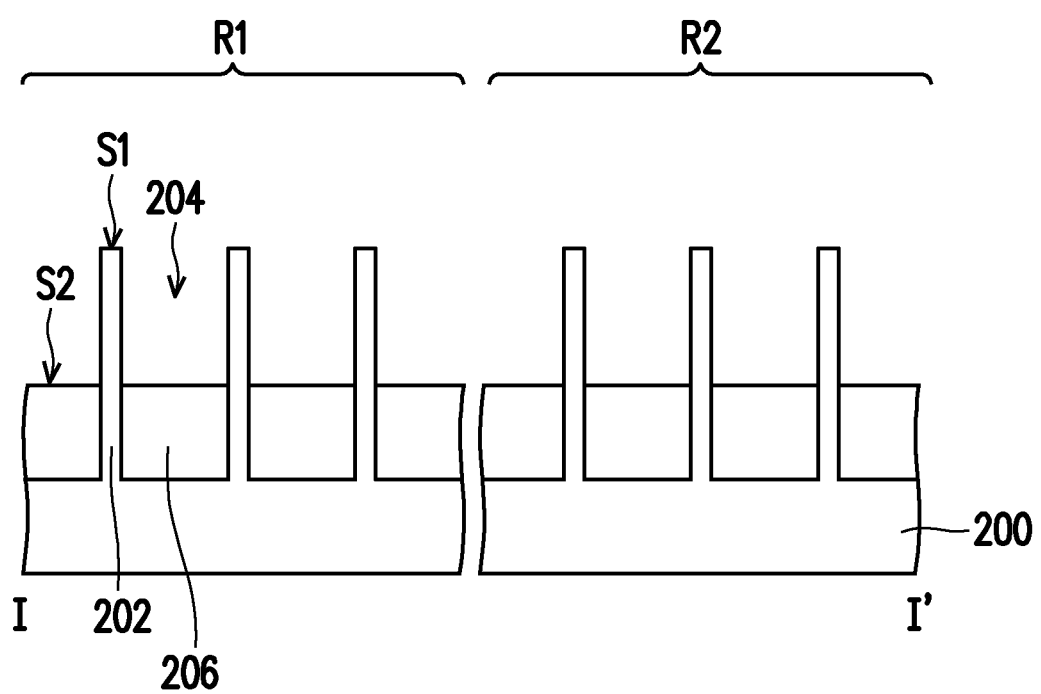
FIG. 4A to FIG. 4E respectively are cross-sectional views taken along line I-I' of FIG. 3A to FIG. 3C and FIG. 3G to FIG. 3H.

FIG. 3A is a perspective view illustrating one of various stages of a method of fabricating semiconductor devices 20 and 22 in accordance with some embodiments of the disclosure. FIG. 4A is a cross-sectional view taken along line I-I' of FIG. 3A. Referring to FIG. 3A and FIG. 4A, a substrate 200 is provided in a chamber (not shown). In some embodiments, the substrate 200 may be placed in the desired chamber based on the sequential processes. In some embodiments, the substrate 200 may include an I/O device region R1 and a core device region R2. The substrate 200 includes at least one fin 202 thereon. In some embodiments, the substrate 200 may have a plurality of fins 202. The substrate 200 may include a plurality of trenches 204 therein. Each trench 204 is located between the two adjacent fins 202. In some embodiments, the substrate 200 may be a bulk semiconductor substrate, a SOI substrate, or the like. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate, may also be used.

In some embodiments, a plurality of insulators 206 are formed in the trenches 204. Each fin 202 is sandwiched between two adjacent insulators 206. In some embodiments, top surfaces S2 of the insulators 206 are lower than top surfaces S1 of the fins 202. For example, the fins 202 protrude from the top surfaces S2 of the insulators 206. In some embodiments, the insulators 206 may be referred to as "Shallow Trench Isolation (STI)." In some embodiments, the top surfaces S2 of the insulators 206 may have a flat surface (as shown in FIG. 3A and FIG. 4A), a convex surface, a concave surface, or a combination thereof.

Figure 3B:
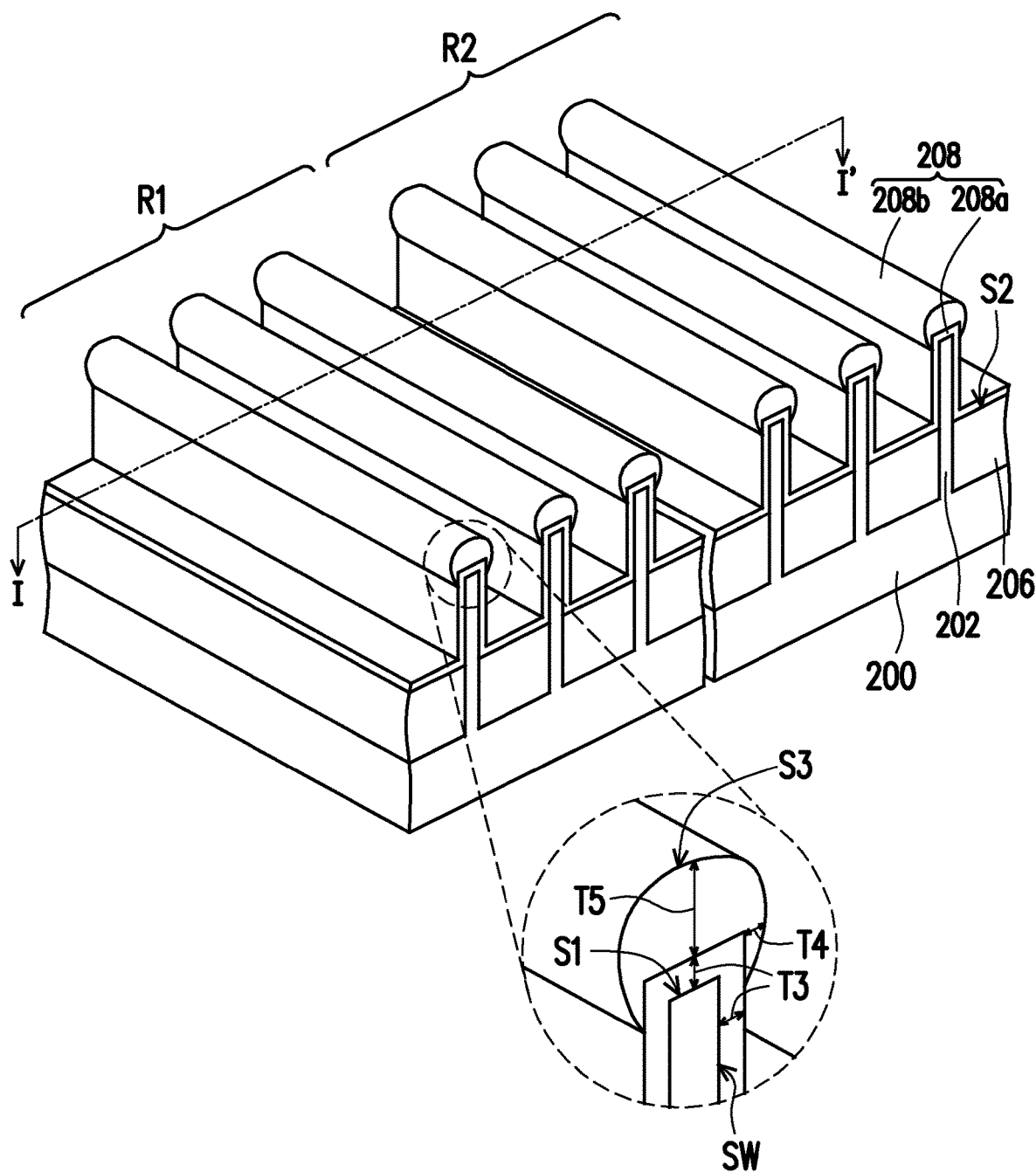
Figure 4B:
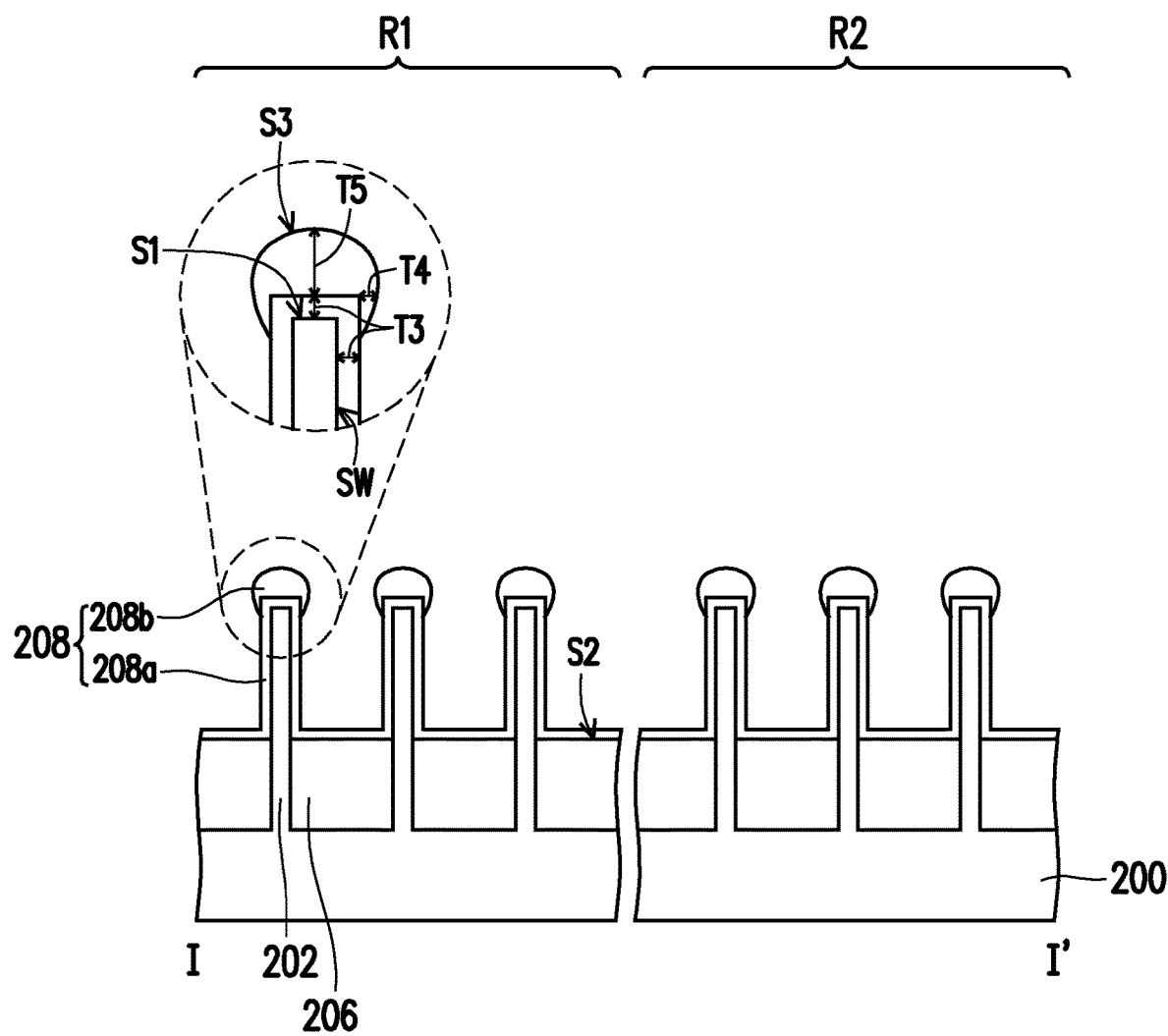

FIG. 3B is a perspective view illustrating one of various stages of a method of fabricating the semiconductor devices 20 and 22 in accordance with some embodiments of the disclosure. FIG. 4B is a cross-sectional view taken along line I-I' of FIG. 3B. Referring to FIG. 3B and FIG. 4B, a dielectric layer 208a is conformally formed on the fins 202. In some embodiments, the dielectric layer 208a may be further disposed on the insulators 206. In some embodiments, a portion of the dielectric layer 208a on the top surfaces S1 of the fins 202 may be integrally formed with a portion of the dielectric layer 208a on sidewalls SW of the fins 202. That is, the dielectric layer 208a continuously covers the fins 202. In some embodiments, a thickness T3 of the dielectric layer 208a on the top surfaces S1 of the fins 202 may be substantially the same as the thickness T3 of the dielectric layer 208a on the sidewalls SW of the fins 202. In some embodiments, the material of the dielectric layer 208a may be silicon oxide, silicon nitride, silicon carbonitride or the like. In some embodiments, the method of forming the dielectric layer 208a may be an Atomic Layer Deposition (ALD) method.

Then, a dielectric layer 208b is formed on the dielectric layer 208a over the top surfaces S1 of the fins 202. In some embodiments, the dielectric layer 208b may be a single-layered structure or a multi-layered structure. In some embodiments, the dielectric layer 208b may cover portions of the dielectric layer 208a. For example, the dielectric layer 208b may cover less than 20% of the dielectric layer 208a located on the sidewalls SW of the fins 202. In some embodiments, the dielectric layer 208b may cover less than 15% of the dielectric layer 208a located on the sidewalls SW of the fins 202. The dielectric layer 208b may be further disposed on the dielectric layer 208a located on the sidewalls SW of the fins 202. In other words, the dielectric layer 208b may be further extended onto the dielectric layer 208a on the sidewalls SW of the fins 202. In some embodiments, a thickness T4 of the dielectric layer 208b on the sidewalls SW of the fins 202 may be less than a thickness T5 of the dielectric layer 208b on the top surfaces S1 of the fins 202. In some embodiments, the thickness T5 of the dielectric layer 208b is greater than the thickness T3 of the dielectric layer 208a. In some embodiments, the thickness T5 of the dielectric layer 208b may be at least three times the thickness T3 of the dielectric layer 208a. For example, the thickness T5 of the dielectric layer 208b may be 3 to 6 times the thickness T3 of the dielectric layer 208a. In some embodiments, the top surface S3 of the dielectric layer 208b may be convex. In some embodiments, the dielectric layer 208b may have a chef hat shape or a helmet shape. In some embodiments, the material of the dielectric layer 208b may be the same as or different from the material of the material of the dielectric layer 208a. In some embodiments, the material of the dielectric layer 208b may be silicon carbide, silicon carbonitride, silicon nitride, silicon oxide or the like.

After forming the dielectric layer 208a and the dielectric layer 208b, a dielectric structure 208 is formed, and the dielectric structure 208 covers portions of the fins 202. The dielectric structure 208 includes the dielectric layer 208a and the dielectric layer 208b. The first dielectric layer 208a is conformally disposed on the fins 202. The dielectric layer 208b is disposed on the dielectric layer 208a over the top surfaces S1 of the fins 202. In some embodiments, since the dielectric layer 208b is merely formed over portions of the dielectric layer 208a, the dielectric structure 208 is also referred to as a non-conformal dielectric structure. In some embodiments, the thickness (T5+T3) of the dielectric structure 208 located on the top surfaces S1 of the fins 202 is greater than the thickness (T3 or (T3+T4)) of the dielectric structure 208 located on the sidewalls SW of the fins 202.

In some embodiments, the deposition method of FIG. 1 may be applied to form the dielectric layer 208b. For example, the method of forming the dielectric layer 208b may include at least one cycle, and each cycle includes at least following steps. A precursor is introduced into the chamber (step S100). The precursor is adsorbed on the surface of the dielectric layer 208a. Then, a first purging process is performed by a purge gas (step S102). After that, a plasma treatment is performed on the precursor adsorbed onto the top surfaces S1 of the fins 202 (step S104). Then, a second purging process is performed (step S104). Moreover, the details of forming the dielectric layer 208b may refer to the embodiments of FIG. 1, and the description will not be repeated here.

In some embodiments, when the material of the dielectric layer 208a and/or the dielectric layer 208b includes oxide, an oxidation process may be performed on the dielectric layer 208a and/or the dielectric layer 208b. For example, the oxidation process may be performed before the step of removing the dielectric layer 208a and the dielectric layer 208b in the core device region R2. However, the disclosure is not limited thereto. In some alternative embodiments, the oxidation process performed on the dielectric layer 208a and/or the dielectric layer 208b may be omitted.

Figure 3C:
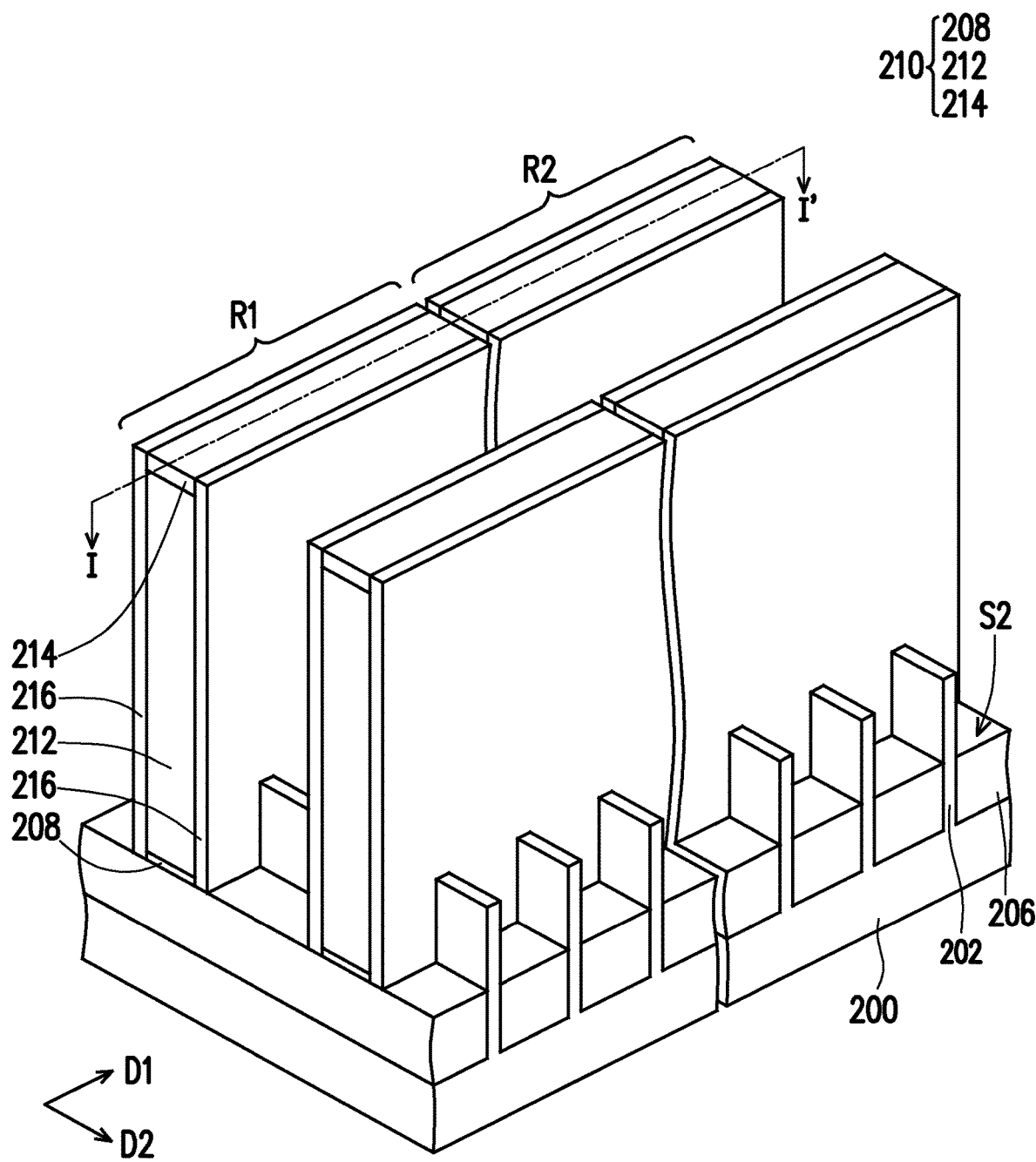
Figure 4C:
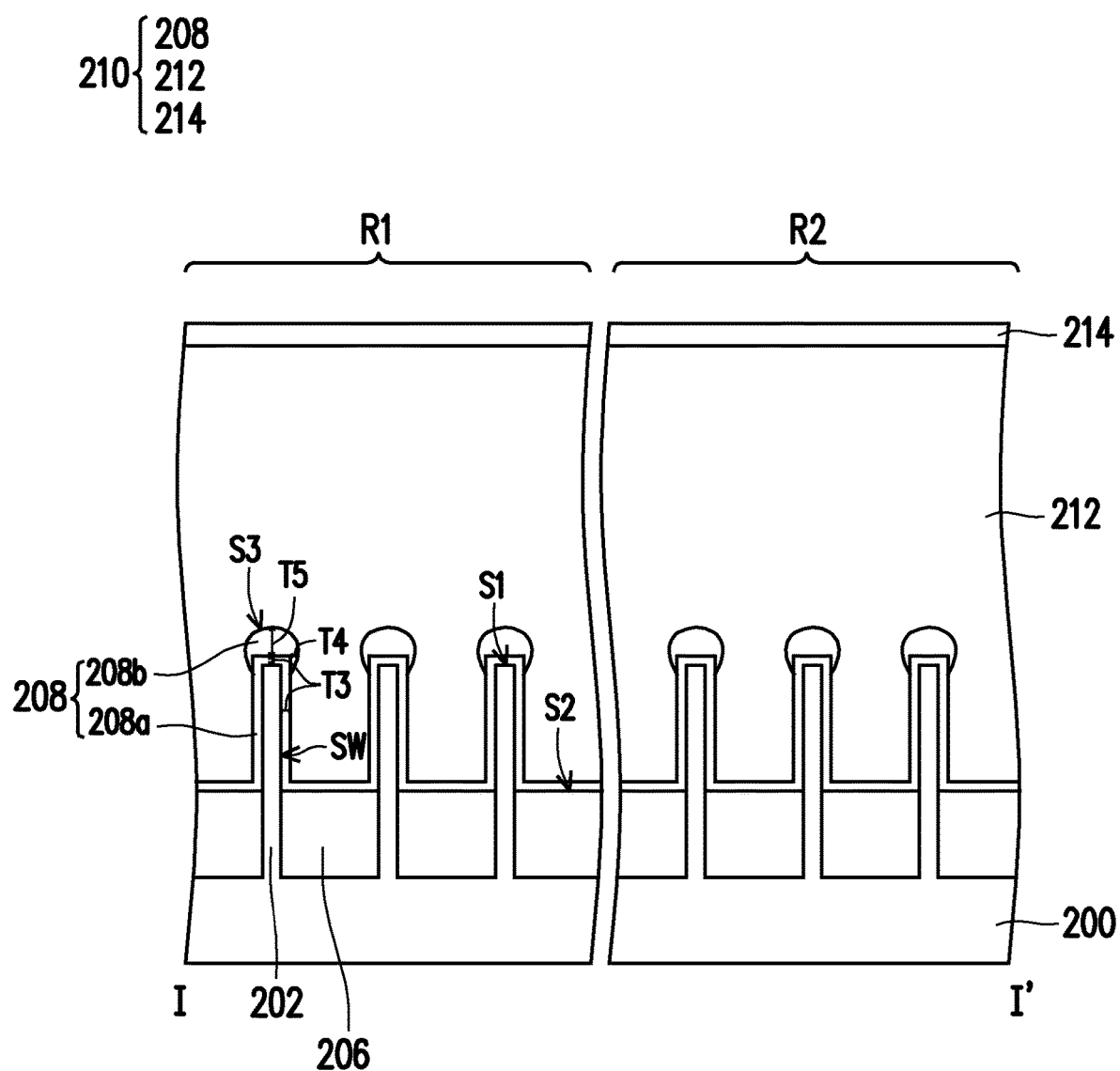

FIG. 3C is a perspective view illustrating one of various stages of a method of fabricating the semiconductor devices 20 and 22 in accordance with some embodiments of the disclosure. FIG. 4C is a cross-sectional view taken along line I-I' of FIG. 3C. Referring to FIG. 3C and FIG. 4C, a plurality of dummy gate structures 210 is formed over a portion of the fins 202 and a portion of the insulators 206. In some embodiments, the dummy gate structures 210 are formed across the fins 202. For example, an extending direction D1 of the dummy gate structures 210 may be perpendicular to an extending direction D2 of the fins 202. In some embodiments, each dummy gate structure 210 may include the dielectric structure 208, a dummy gate 212 disposed over the dielectric structure 208, and a mask layer 214 disposed over the dummy gate 212. In some embodiments, before forming the dummy gate 212, a portion of the dielectric structure 208 is removed, in other words, portions of the dielectric layer 208a and the dielectric layer 208b are removed. Thus, as shown in FIG. 3C, a portion of the fins 202 is exposed.

Then, as illustrated in FIG. 3C and FIG. 4C, the dummy gate 212 is formed on the dielectric structure 208. The dielectric structure 208 may be used to separate the fins 202 and the dummy gate 212. In some embodiments, the dummy gate 212 may be a single-layered structure or a multi-layered structure. In some embodiments, the dummy gate 212 includes a silicon-containing material, such as poly-silicon, amorphous silicon, or a combination thereof. The dummy gate 212 may be formed by a suitable process, such as ALD, Chemical Vapor Deposition (CVD), Physical Vapor Deposition (PVD), plating, or a combination thereof. In some embodiments, the mask layer 214 is then formed on the dummy gate 212. In some embodiments, the mask layer 214 may be formed of silicon nitride, silicon oxide, silicon carbonitride, combinations thereof, or the like.

In addition to the dummy gate structures 210, multiple pairs of spacers 216 are also formed over portions of the fins 202 and portions of the insulators 206. As illustrated in FIG. 3C and FIG. 4C, the spacers 216 are disposed on sidewalls of the dummy gate structures 210. For example, the dielectric structure 208, the dummy gate 212, and the mask layer 214 are sandwiched between a pair of spacers 216. In some embodiments, the spacers 216 and the dummy gate structures 210 may have the same extending direction D1. In some embodiments, the spacers 216 may be formed of dielectric materials, such as silicon oxide, silicon nitride, silicon carbonitride, SiCON, or a combination thereof. In some embodiments, the spacers 216 may be formed by a thermal oxidation or a deposition followed by an anisotropic etch. It should be noted that the spacers 216 may be a single-layered structure or a multi-layered structure.

Figure 3D:
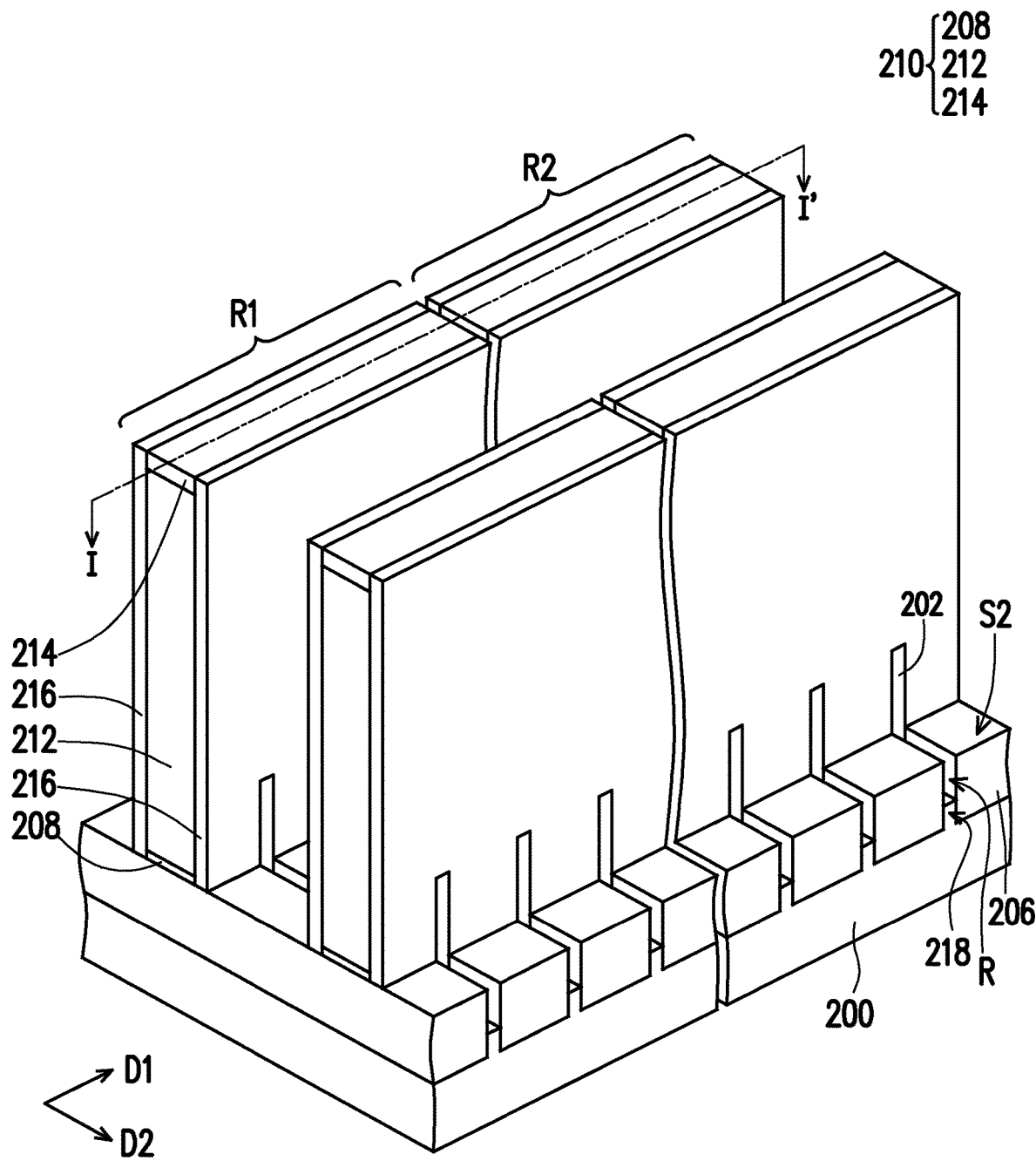

FIG. 3D is a perspective view illustrating one of various stages of a method of fabricating the semiconductor devices 20 and 22 in accordance with some embodiments of the disclosure. Referring to FIG. 3D, the fins 202 exposed by the dummy gate structure 210 and the spacers 216 are removed/recessed to form a plurality of recessed portions R. Portions of the fins 202 may be removed by, for example, anisotropic etching, isotropic etching, or a combination thereof. In some embodiments, portions of the fins 202 are recessed below the top surfaces S2 of the insulators 206. In some embodiments, a depth of the recessed portions R is less than a thickness of the insulators 206. In other words, the fins 202 exposed by the dummy gate structure 210 and the spacers 216 are not entirely removed, and the remaining fins 202 located in the recessed portion R form source/drain regions 218 of the fins 202. As illustrated in FIG. 3D, the fins 202 covered by the dummy gate structure 210 and the spacers 216 are not etched and are exposed at sidewalls of the spacers 216.

Figure 3E:
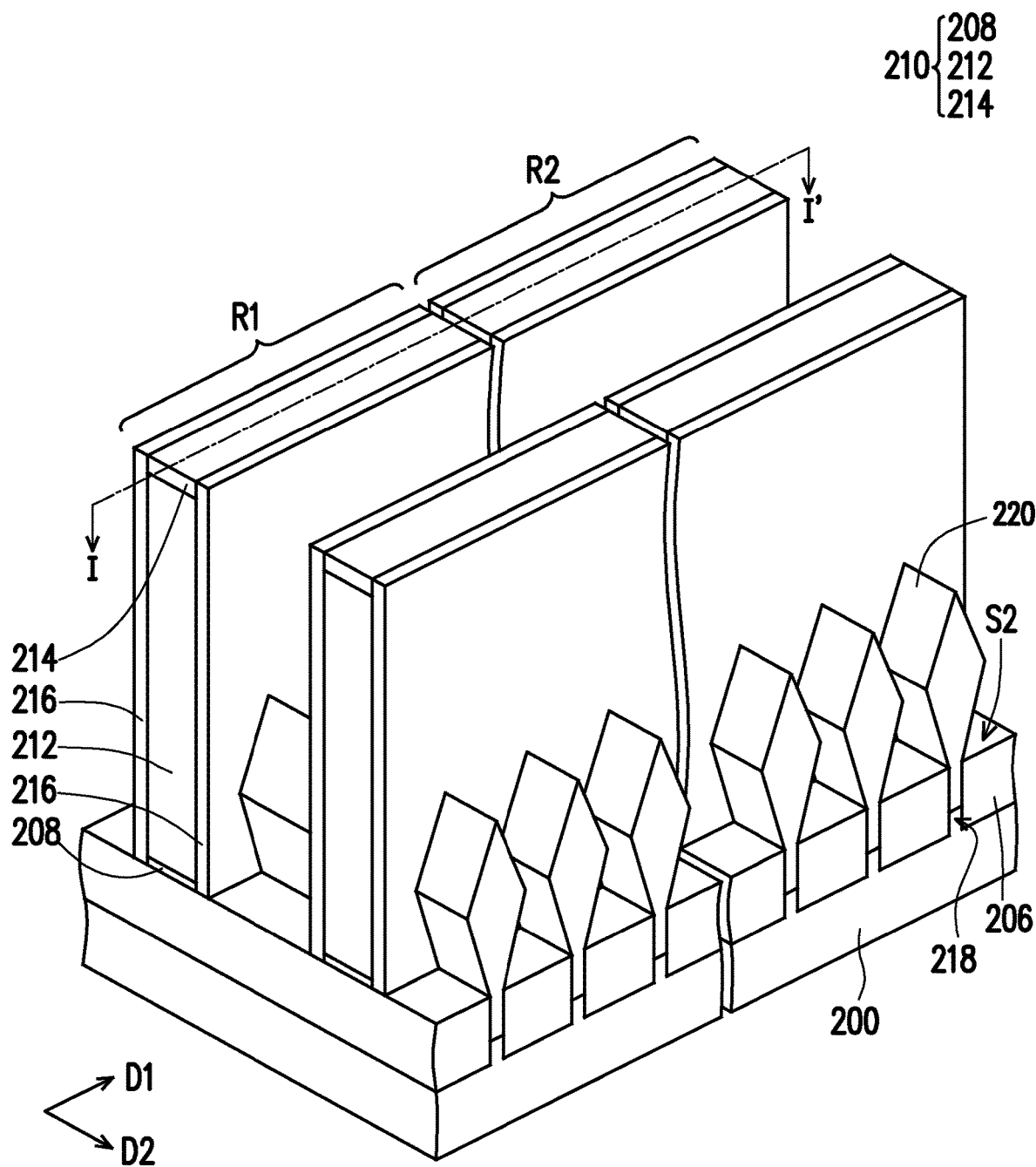

FIG. 3E is a perspective view illustrating one of various stages of a method of fabricating the semiconductor devices 20 and 22 in accordance with some embodiments of the disclosure. Referring to FIG. 3E, a plurality of strained material structures 220 (or a highly doped low resistance material structure) is grown over the recessed portions R of the fins 202 and extends beyond the top surfaces S2 of the insulators 206. That is, the strained material structures 220 may be formed over portions of the fins 202 revealed by the dummy gate structure 210 and the spacers 216. In some embodiments, the strained material structures 220 are formed over the source/drain regions 218 of the fins 202 to function as sources/drains of the subsequently formed device. In some embodiments, the strained material structures 220 may be doped with a conductive dopant. In some embodiments, the strained material structures 220, such as SiGe, SiGeB, Ge, GeSn, SiC, SiP, SiCP, a combination of SiC/SiP, or the like, are epitaxial-grown with dopants. In some alternative embodiments, the strained material structures 220 may also include III-V compound semiconductors, such as GaAs, InP, GaN, InGaAs, InAlAs, GaSb, AlSb, AlAs, AlP, GaP, or a combination thereof. It should be noted that the recess step illustrated in FIG. 3D may be omitted in some embodiments. For example, the strained material structures 220 may be formed on the un-recessed fins 202. That is, the strained material structures 220 may be formed on the source/drain regions 218 of the un-recessed fins 202.

Figure 3F:
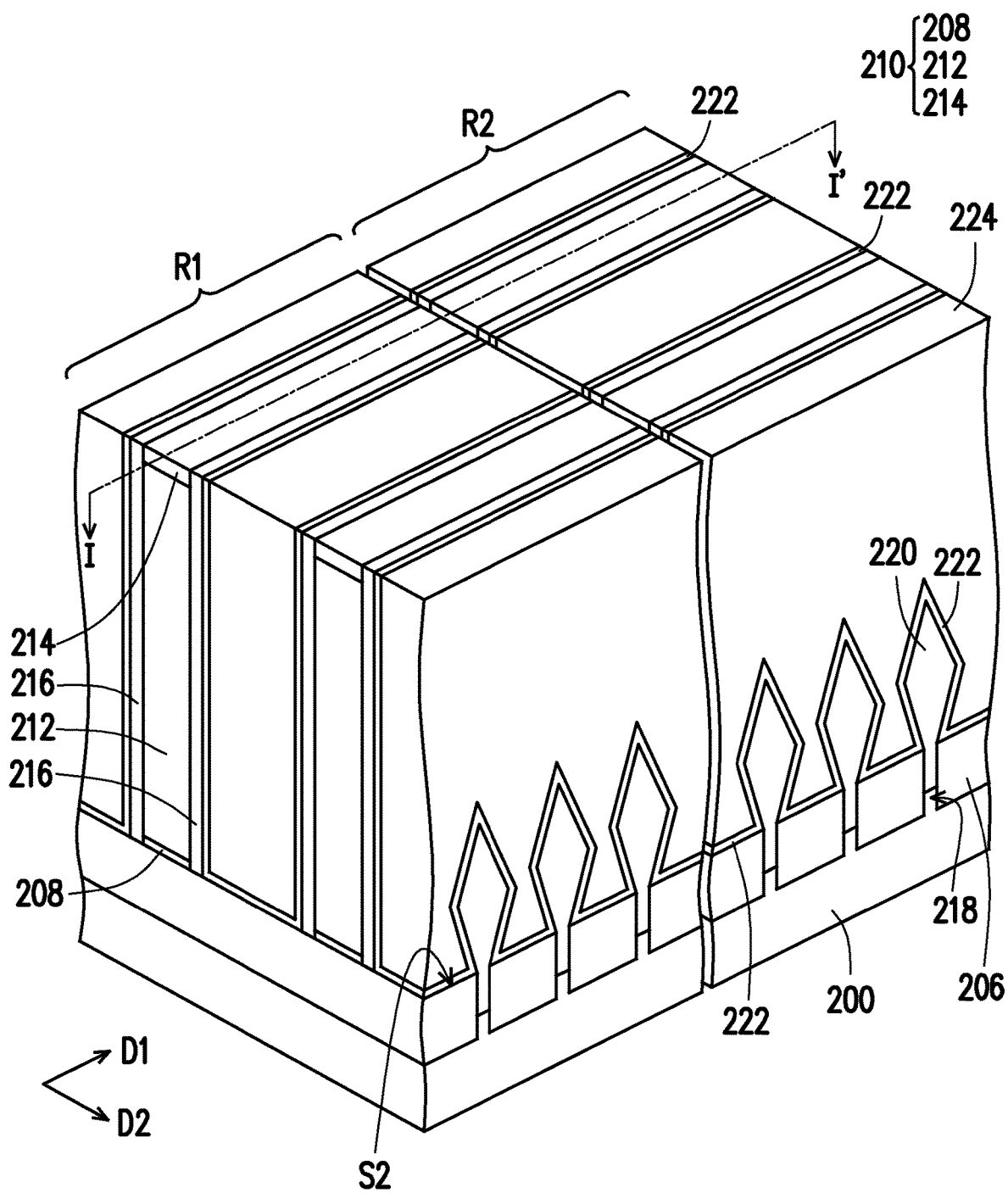

FIG. 3F is a perspective view illustrating one of various stages of a method of fabricating the semiconductor devices 20 and 22 in accordance with some embodiments of the disclosure. Referring to FIG. 3F, an etch stop layer 222 and an interlayer dielectric layer 224 are sequentially formed over the strained material structures 220 and the insulators 206. In some embodiments, the etch stop layer 222 is formed adjacent to the spacers 216. As illustrated in FIG. 3F, the etch stop layer 222 is conformally formed on the top surfaces S2 of the insulators 206 and the strained material structures 220. In some embodiments, the etch stop layer 222 may be formed of silicon oxide, silicon nitride, silicon carbo-nitride, or the like. In some embodiments, the etch stop layer 222 may be formed through, for example, CVD, Sub Atmospheric Chemical Vapor Deposition (SACVD), Molecular Layer Deposition (MLD), ALD, or the like. In some embodiments, the etch stop layer 320 may be referred to as "contact etch stop layer (CESL)."

As illustrated in FIG. 3F, the interlayer dielectric layer 224 is formed on the etch stop layer 222. In some embodiments, the interlayer dielectric layer 224 includes silicon oxide, silicon nitride, silicon oxynitride, phosphosilicate glass (PSG), borophosphosilicate glass (BPSG), spin-on glass (SOG), fluorinated silica glass (FSG), carbon doped silicon oxide (e.g., SiCOH), polyimide, and/or a combination thereof. In some alternative embodiments, the interlayer dielectric layer 224 includes low-k dielectric materials. It is understood that the interlayer dielectric layer 224 may include one or more dielectric materials and/or one or more dielectric layers. In some embodiments, the interlayer dielectric layer 224 is formed to a suitable thickness by Flowable Chemical Vapor Deposition (FCVD), CVD, High Density Plasma Chemical Vapor Deposition (HDPCVD), SACVD, spin-on, sputtering, or other suitable methods. For example, an interlayer dielectric material layer (not shown) may be formed to cover the etch stop layer 222, the dummy gate structures 210, and the spacers 216. Subsequently, the thickness of the interlayer dielectric material layer is reduced until a top surface of the dummy gate structure 210 is exposed, so as to form the interlayer dielectric layer 224. The reduction the thickness of the interlayer dielectric material layer may be achieved by a chemical mechanical polishing (CMP) process, an etching process, or other suitable processes. After reducing the thickness of the interlayer dielectric material layer, top surfaces of the dummy gate structures 210, top surfaces of the spacers 216, a top surface of the etch stop layer 222, and a top surface of the interlayer dielectric layer 224 are substantially coplanar.

Figure 3G:
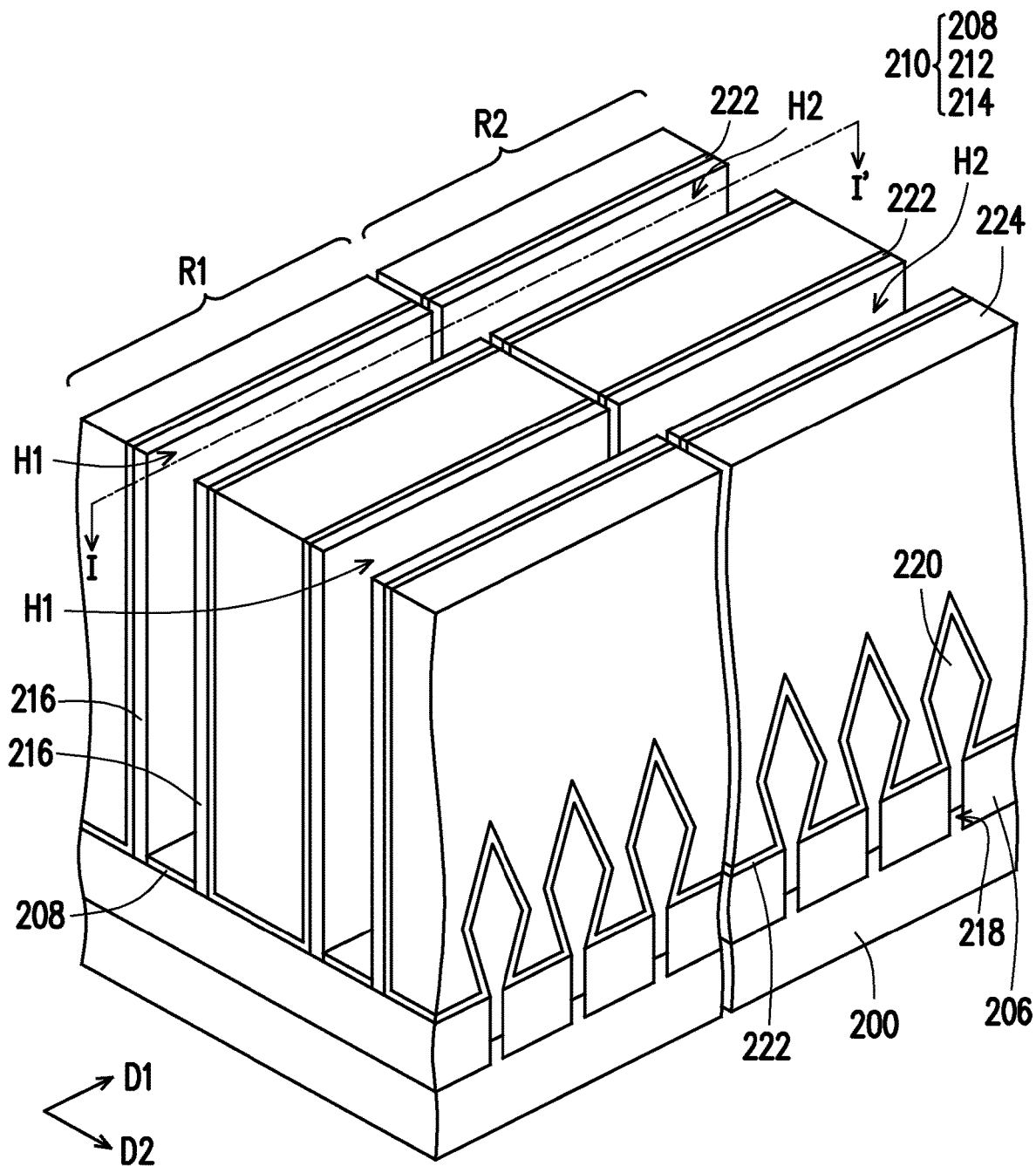
Figure 4D:
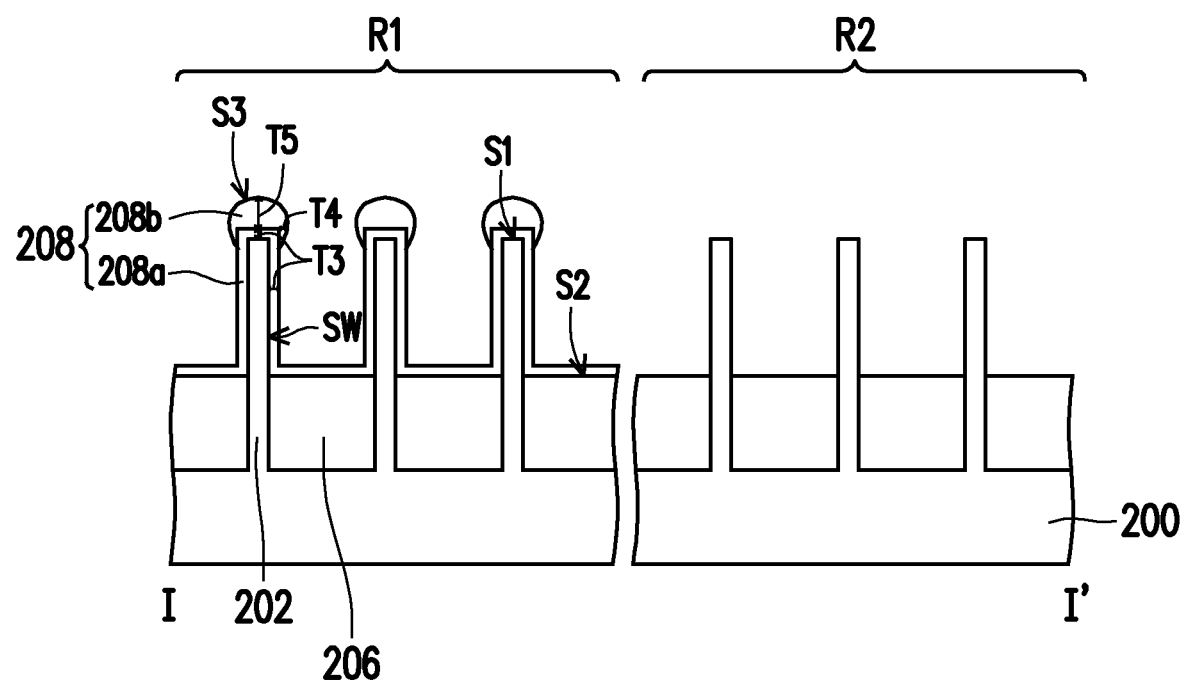

FIG. 3G is a perspective view illustrating one of various stages of a method of fabricating the semiconductor devices 20 and 22 in accordance with some embodiments of the disclosure. FIG. 4D is a cross-sectional view taken along line I-I' of FIG. 3G. Referring to FIG. 3G and FIG. 4D, the mask layers 214 and the dummy gates 212 in the I/O device region R1 are removed to form hollow portions H1 between two adjacent spacers 216. Thereby, the dielectric structures 208 are exposed by the hollow portions H1 in the I/O device region R1. Furthermore, the mask layers 214, the dummy gates 212, the dielectric layer 208b, and dielectric layer 208a in the core device region R2 are removed to form hollow portions H2 between two adjacent spacers 216. Thereby, the fins 202 are exposed by the hollow portions H2 in the core device region R2. In some embodiments, the mask layers 214 and the dummy gates 212 in the I/O device region R1 and the mask layers 214 and the dummy gates 212 in the core device region R2 may be removed simultaneously. In some embodiments, when the dielectric layer 208b and the dielectric layer 208a in the core device region R2 are removed, a photo resist layer (not shown) is formed in the I/O device region R1 to protect the dielectric layer 208b and the dielectric layer 208a in the I/O device region R1. The photo resist layer is removed after the dielectric layer 208b and the dielectric layer 208a in the core device region R2 are removed. As a result, the dielectric layer 208b, and the dielectric layer 208a in the I/O device region R1 are remained. That is, the dielectric structure 208 is located in the I/O device region R1.

Figure 3H:
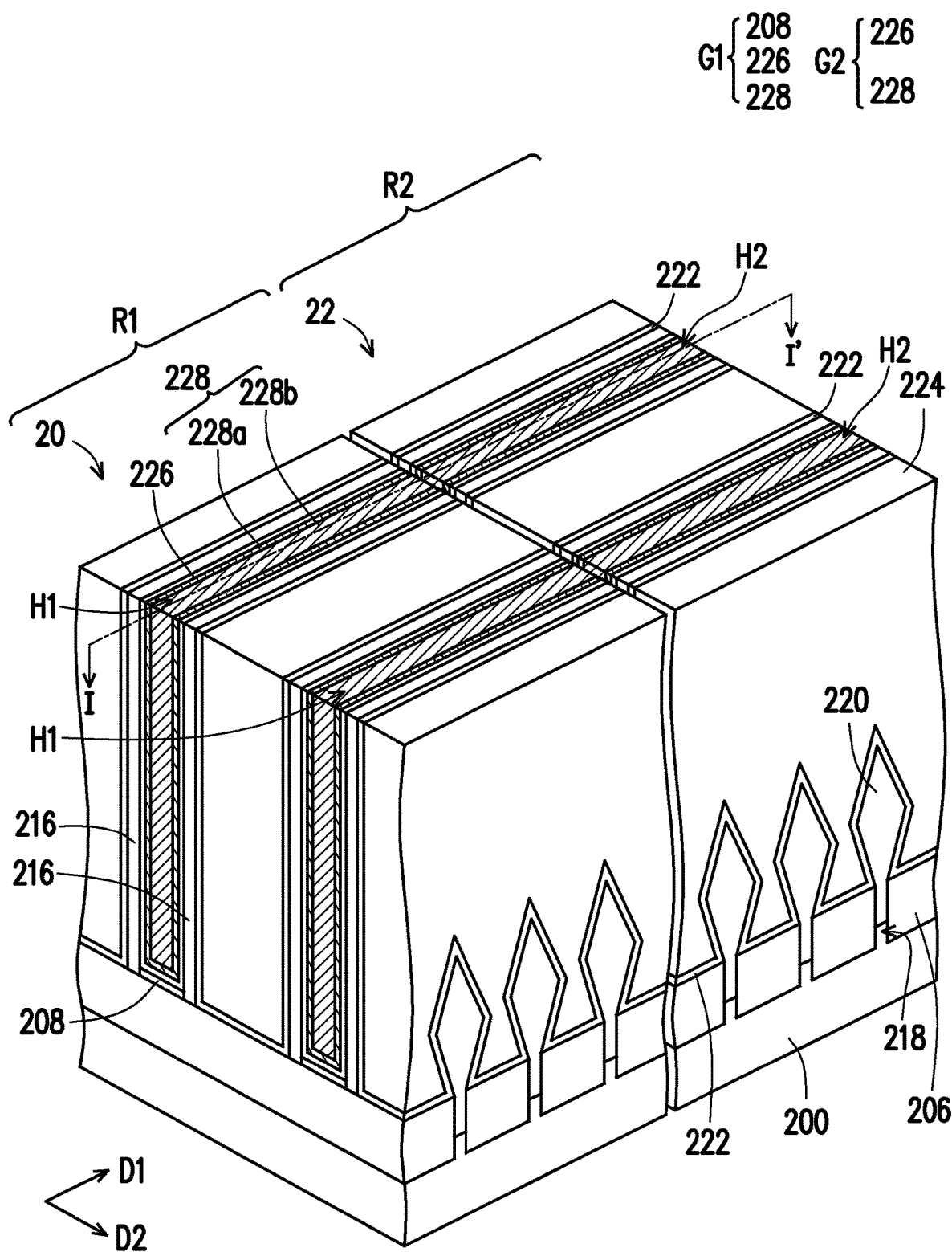
Figure 4E:
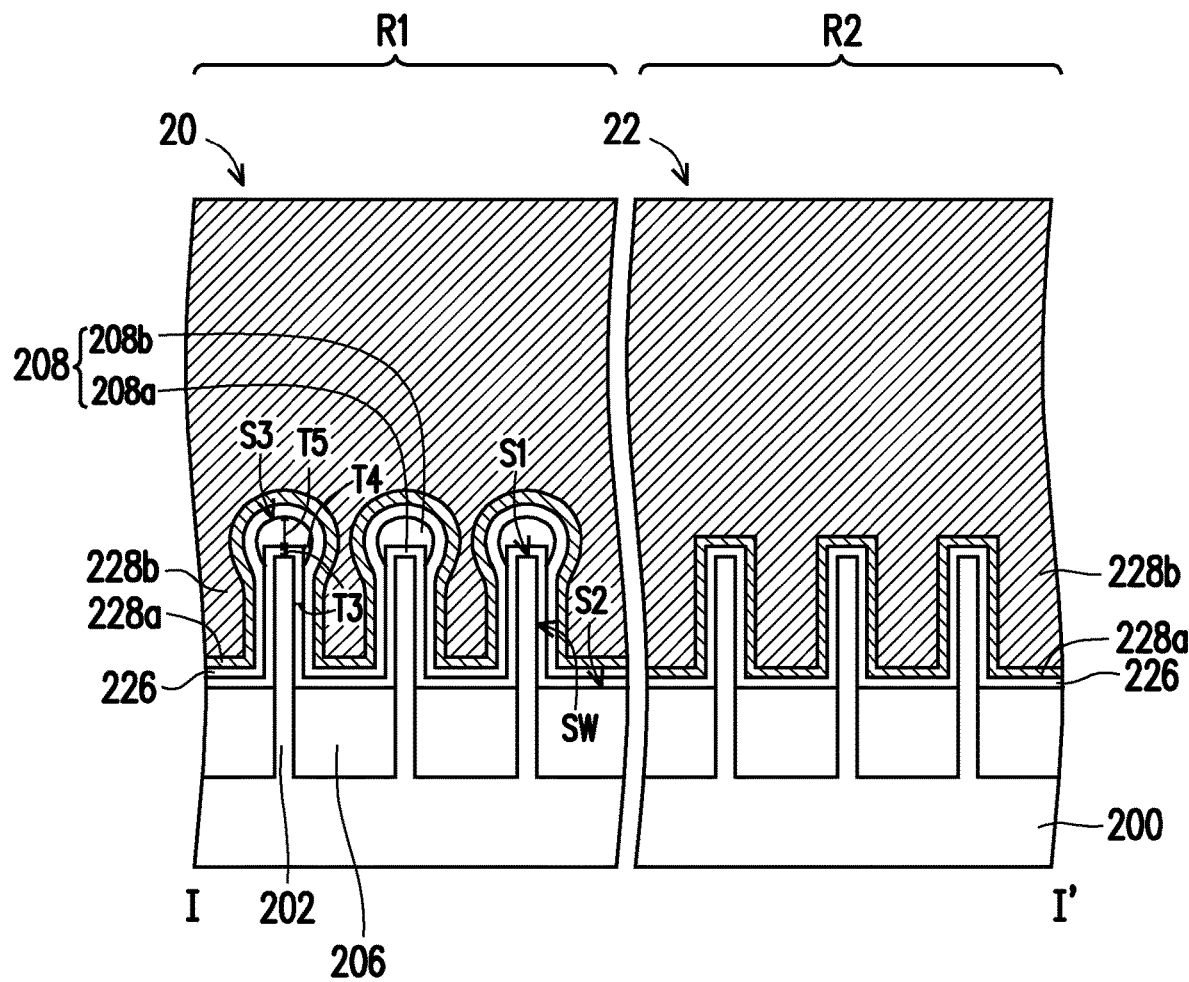

FIG. 3H is a perspective view illustrating one of various stages of a method of fabricating the semiconductor devices 20 and 22 in accordance with some embodiments of the disclosure. FIG. 4E is a cross-sectional view taken along line I-I' of FIG. 3H. Referring to FIG. 3H and FIG. 4E, a gate dielectric layer 226, a work function layer 228a, and a metal layer 228b are sequentially formed into the hollow portions H1 and H2 to form gate structures G1 and G2. For example, each gate structure G1 is located in the corresponding hollow portion H1 and is sandwiched between the neighboring spacers 216 in the I/O device region R1. Moreover, each gate structure G2 is located in the corresponding hollow portion H2 and is sandwiched between the neighboring spacers 216 in the core device region R2. As illustrated in FIG. 3H and FIG. 4E, the gate structures G1 and G2 are disposed across the fins 202. In some embodiments, the work function layer 228a and the metal layer 228b may be collectively referred to as a gate 228 of the gate structures G1 and G2. In some embodiments, the gate 228 is formed over the dielectric layer 208a and the dielectric layer 208b. That is, the gate 228 is disposed over the dielectric structure 208.

In some embodiments, the gate dielectric layer 226 is conformally formed on the dielectric structure 208 in the I/O device region R1. The gate dielectric layer 226 is formed on the fins 202 in the core device region R2. In some embodiments, the material of the gate dielectric layer 226 may be identical to or different from the material of the dielectric structure 208. For example, the gate dielectric layer 226 includes silicon oxide, silicon nitride, silicon oxynitride, or a combination thereof. In some alternative embodiments, the gate dielectric layers 226 are made of a high-k dielectric material. In some embodiments, the gate dielectric layer 226 may be formed by, for example, Molecular-Beam Deposition (MBD), ALD, PECVD, thermal oxidation, UV-ozone oxidation, a combination thereof, or the like. In some embodiments, the gate dielectric layer 226 in the core device region R2 may further include an interfacial layer (not shown).

As illustrated in FIG. 3H and FIG. 4E, the work function layer 228a is conformally formed on the gate dielectric layer 226. In some embodiments, the work function layer 228a includes p-type or n-type work function metals. Exemplary p-type work function metals include TiN, TaN, Ru, Mo, Al, WN, $ZrSi_2$, $MoSi_2$, $TaSi_2$, $NiSi_2$, WN, other suitable p-type work function materials, or combinations thereof. On the other hand, exemplary n-type work function metals include Ti, Ag, TaAl, TaAlC, TiAlN, TaC, TaCN, TaSiN, Mn, Zr, other suitable n-type work function materials, or combinations thereof. In some embodiments, the work function layer 228a may be formed by, for example, CVD, PECVD, ALD, Remote Plasma Atomic Layer Deposition (RPALD), Plasma-Enhanced Atomic Layer Deposition (PEALD), MBD, or the like. In some embodiments, the work function layer 228a may serve the purpose of adjusting threshold voltage (Vt) of the subsequently formed semiconductor device.

The metal layer 228b is formed on the work function layer 228a. In some embodiments, the metal layer 228b may include tungsten, cobalt, or the like. In some embodiments, the metal layer 228b is formed through CVD. In some embodiments, a barrier layer (not shown) may exist between the metal layer 228b and the work function layer 228a.

During the formation of the gate dielectric layer 226, the work function layer 228a, and the metal layer 228b, excessive portions of these layers may be formed outside of the hollow portions H1 and H2. For example, excessive portions of these layers are formed on the etch stop layer 222 and the interlayer dielectric layer 224. As such, a planarization process, such as a CMP process, may be performed to remove excessive portions of these layers to render the structure illustrated in FIG. 3H and FIG. 4E. As illustrated in FIG. FIG. 3H and FIG. 4E, the gate dielectric layer 226 and the work function layer 228a have U-shaped cross-sectional views. The steps illustrated in FIG. 3G to FIG. 3H and FIG. 4D to FIG. 4E is commonly referred to as a "metal gate replacement process."

In some embodiments, each gate structure G1 may include the dielectric structure 208, the gate dielectric layer 226, and the gate 228, and each gate structure G2 may include the gate dielectric layer 226 and the gate 228. In the I/O device region R1, the gate dielectric layer 226 is disposed on the dielectric structure 208, and the gate 228 is disposed on the gate dielectric layer 226. In the core device region R2, the gate dielectric layer 226 is disposed on the fin 202, and the gate 228 is disposed on the gate dielectric layer 226. Therefore, the semiconductor device 20 has the dielectric structure 208, and the semiconductor device 22 does not have the dielectric structure 208.

Figure 5:
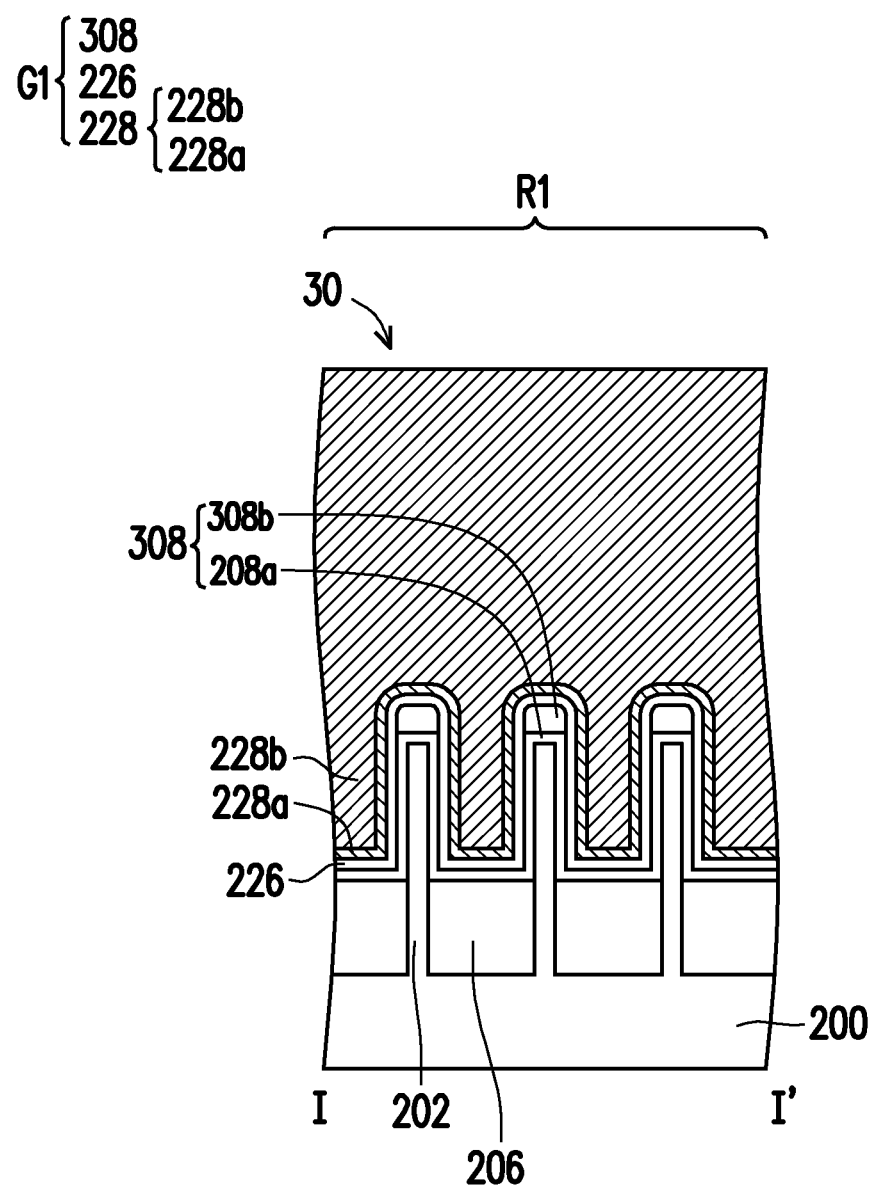
FIG. 5 is a cross-sectional view illustrating a semiconductor device in accordance with some alternative embodiments of the disclosure.

FIG. 5 is a cross-sectional view illustrating a semiconductor device 30 in accordance with some alternative embodiments of the disclosure. The semiconductor device 30 in FIG. 5 is similar to the semiconductor device 20 in FIG. 4E, so similar elements are denoted by the same reference numeral and the detailed descriptions thereof are omitted herein. In some embodiments, as shown in FIG. 5, the dielectric structure 308 includes the dielectric layer 208a and a dielectric layer 308b. In some embodiments, the sidewall of the dielectric layer 308b may be substantially flush with the sidewall of the dielectric layer 208a. In some embodiments, the dielectric structure 308 may be a non-conformal dielectric structure.

In some embodiments, since the thickness of the dielectric structure located on the top surfaces of the fins is greater than the thickness of the dielectric structure located on the sidewalls of the fins, the oxide regrowth on the surface of the fins from externally (subsequent) heavy oxidation process in the I/O device region may be prevented, and the DC (direct current) performance of the semiconductor device may be improved. Furthermore, during the gap-filling process of the metal layer in the I/O device region, the generation of void may be prevented by controlling the thickness of the dielectric layer located at the sidewalls of the fins.

In accordance with some embodiments of the disclosure, a semiconductor device includes a substrate and a dielectric structure. The substrate includes at least one fin thereon. The dielectric structure covers the at least one fin. A thickness of the dielectric structure located on a top surface of the at least one fin is greater than a thickness of the dielectric structure located on a sidewall of the at least one fin. The dielectric structure includes a first dielectric layer and a second dielectric layer. The first dielectric layer is conformally disposed on the at least one fin. The second dielectric layer is disposed on the first dielectric layer over the top surface of the at least one fin. A thickness of the second dielectric layer is greater than a thickness of the first dielectric layer.

In accordance with some embodiments of the disclosure, a method of fabricating a semiconductor device includes at least the following steps. A substrate is provided in a chamber. The substrate includes at least one fin thereon. A first dielectric layer is conformally formed on the at least one fin. A second dielectric layer is formed on the first dielectric layer over a top surface of the at least one fin. The method of forming the second dielectric layer includes at least one cycle. Each cycle includes at least following steps. A precursor is introduced into the chamber. The precursor is adsorbed on a surface of the first dielectric layer. A first purging process is performed by a purge gas. A plasma treatment is performed on the precursor adsorbed onto the top surface of the at least one fin. A second purging process is performed. A pressure maintained in the chamber during the forming the second dielectric layer ranges from 3000 mTorr to 4000 mTorr. A first purge time of the first purging process ranges from 0.1 to 1 second. A time of the plasma treatment ranges from 0.1 to 0.5 second. A second purge time of the second purging process ranges from 0.1 to 1 second.

In accordance with some alternative embodiments of the disclosure, a deposition method includes a plurality of cycles. Each cycle includes at least the following steps. A precursor is introduced into a chamber. A first purging process is performed by a purge gas. A plasma treatment is performed on the precursor. A second purging process is performed. A pressure maintained in the chamber is higher than or equal to 3000 mTorr. A first purge time of the first purging process is less than or equal to 1 second. A time of the plasma treatment ranges is less than or equal to 0.5 second. A second purge time of the second purging process is less than or equal to 1 second.

In accordance with some alternative embodiments of the disclosure, a semiconductor device includes a semiconductor substrate and a first dielectric layer. The semiconductor substrate includes at least one fin. The first dielectric layer is disposed on the at least one fin. A thickness of the first dielectric layer located on a top surface of the at least one fin is greater than a thickness of the first dielectric layer located on a sidewall of the at least one fin.

In accordance with some alternative embodiments of the disclosure, a semiconductor device includes a semiconductor substrate, a dielectric layer, a plurality of dielectric patterns. The semiconductor substrate includes a plurality of protrusions. The dielectric layer is continuously disposed on the protrusions. The dielectric patterns are disposed on the dielectric layer and cover the protrusions respectively. A thickness of the dielectric patterns located on top surfaces of the protrusions is respectively greater than a thickness of the dielectric patterns located on sidewalls of the protrusions.

In accordance with some alternative embodiments of the disclosure, a semiconductor device includes a semiconductor substrate, a dielectric layer, a plurality of dielectric patterns and a gate. The semiconductor substrate includes a plurality of fins. The dielectric layer is disposed on sidewalls and tops of the fins. The dielectric patterns are disposed on the dielectric layer and enclose the tops of the fins. A distance between the dielectric patterns decreases as the dielectric patterns become closer to the tops of the fins. The gate covers the dielectric patterns and the dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a semiconductor substrate comprising at least one fin;
   a first dielectric layer on the at least one fin, wherein a thickness of the first dielectric layer located on a top surface of the at least one fin is greater than a thickness of the first dielectric layer located on a sidewall of the at least one fin; and
   a gate, covering the first dielectric layer.

2. The semiconductor device according to claim 1, further comprising a second dielectric layer between the at least one fin and the first dielectric layer.

3. The semiconductor device according to claim 2, wherein a thickness of the second dielectric layer is substantially the same.

4. The semiconductor device according to claim 2, wherein the thickness of the first dielectric layer located on the top surface of the at least one fin is greater than a thickness of the second dielectric layer located on the top surface of the at least one fin.

5. The semiconductor device according to claim 4, wherein the thickness of the first dielectric layer located on the top surface of the at least one fin is 3 to 6 times the thickness of the second dielectric layer located on the top surface of the at least one fin.

6. The semiconductor device according to claim 2, wherein a sidewall of the first dielectric layer is substantially flush with a sidewall of the second dielectric layer.

7. The semiconductor device according to claim 2, wherein the second dielectric layer is further disposed on the sidewall of the at least one fin.

8. The semiconductor device according to claim 7, wherein the thickness of the first dielectric layer on the sidewall of the at least one fin is less than a thickness of the second dielectric layer on the sidewall of the at least one fin.

9. The semiconductor device according to claim 1, wherein a top surface of the first dielectric layer is convex.

10. The semiconductor device according to claim 1, wherein the first dielectric layer has a chef hat shape or a helmet shape.

11. A semiconductor device, comprising:
    a semiconductor substrate comprising a plurality of protrusions;
    a dielectric layer disposed on the protrusions;
    a plurality of dielectric patterns on the dielectric layer and covering the protrusions respectively, wherein a thickness of the dielectric patterns located on top surfaces of the protrusions is respectively greater than a thickness of the dielectric patterns located on sidewalls of the protrusions; and
    a gate, covering the dielectric patterns.

12. The semiconductor device according to claim 11, wherein a thickness of the dielectric layer is substantially the same.

13. The semiconductor device according to claim 12, wherein the thickness of the dielectric patterns located on the top surfaces of the protrusions is greater than a thickness of the dielectric layer located on the top surfaces of the protrusions.

14. The semiconductor device according to claim 11, wherein the thickness of the dielectric patterns located on the sidewalls of the protrusions respectively decreases as the dielectric patterns become closer to the semiconductor substrate.

15. The semiconductor device according to claim 11, wherein the dielectric patterns are separated from each other.

16. A semiconductor device, comprising:
    a semiconductor substrate comprising a plurality of fins;
    a dielectric layer on sidewalls and tops of the fins;
    a plurality of dielectric patterns on the dielectric layer and enclosing the tops of the fins, wherein a distance between the dielectric patterns decreases as the dielectric patterns become closer to the tops of the fins; and
    a gate, covering the dielectric patterns and the dielectric layer.

17. The semiconductor device according to claim 16, wherein a thickness of the dielectric layer is substantially the same.

18. The semiconductor device according to claim 16, wherein a thickness of the dielectric patterns located on the tops of the fins is greater than a thickness of the dielectric patterns located on the sidewalls of the fins.

19. The semiconductor device according to claim 16, wherein a thickness of the dielectric patterns located on the tops of the fins is greater than a thickness of the dielectric layer located on the tops of the fins.

20. The semiconductor device according to claim 16, wherein the distance between the dielectric patterns decreases and then increases as the dielectric patterns become closer to the tops of the fins.

* * * * *